United States Patent [19]
Oshino et al.

[11] Patent Number: 6,069,937
[45] Date of Patent: May 30, 2000

[54] ILLUMINATION APPARATUS

[75] Inventors: Tetsuya Oshino, Kawasaki; Hiroyuki Kondo, Tsukuba, both of Japan

[73] Assignee: Nikon Corporation, Tokyo, Japan

[21] Appl. No.: 09/118,715

[22] Filed: Jul. 17, 1998

[30] Foreign Application Priority Data

Jul. 18, 1997 [JP] Japan ................................ 9-193994

[51] Int. Cl.[7] .................................................. G21G 4/00
[52] U.S. Cl. .............................. 378/119; 378/34; 378/120
[58] Field of Search ............................ 378/34, 119, 120

[56] References Cited

U.S. PATENT DOCUMENTS

| | | | |
|---|---|---|---|
| 5,204,506 | 4/1993 | Asmus et al. | 219/121.37 |
| 5,459,771 | 10/1995 | Richardson et al. | 378/119 |
| 5,577,092 | 11/1996 | Kublak et al. | 378/119 |
| 5,654,998 | 8/1997 | Turcu et al. | 378/119 |
| 5,668,848 | 9/1997 | Riegar | 378/125 |
| 5,677,939 | 10/1997 | Oshino | 378/34 |

*Primary Examiner*—David P. Porta
*Assistant Examiner*—Allen C. Ho
*Attorney, Agent, or Firm*—Oliff & Berridge, PLC

[57] ABSTRACT

An illumination apparatus for illuminating an object with X-rays. The illumination apparatus has a high illumination efficiency, and the numerical aperture of the X-rays is nearly uniform over an arcuate area, and is independent of the illumination position. The apparatus comprises an excitation energy light generation unit for generating excitation energy light rays and a target member having a curved surface and plurality of X-ray sources formed thereon that emit X-rays when irradiated by the light rays. The apparatus further comprises an illumination optical system that images X-rays from said plurality of X-ray sources onto the object to be illuminated. The target member curved surface may be cylindrical. The target member may also be tape-shaped and provided along the curved surface. Further, the target member may be metallic, particulate, liquid or gas.

15 Claims, 8 Drawing Sheets

FIG. 7
_PRIOR ART_
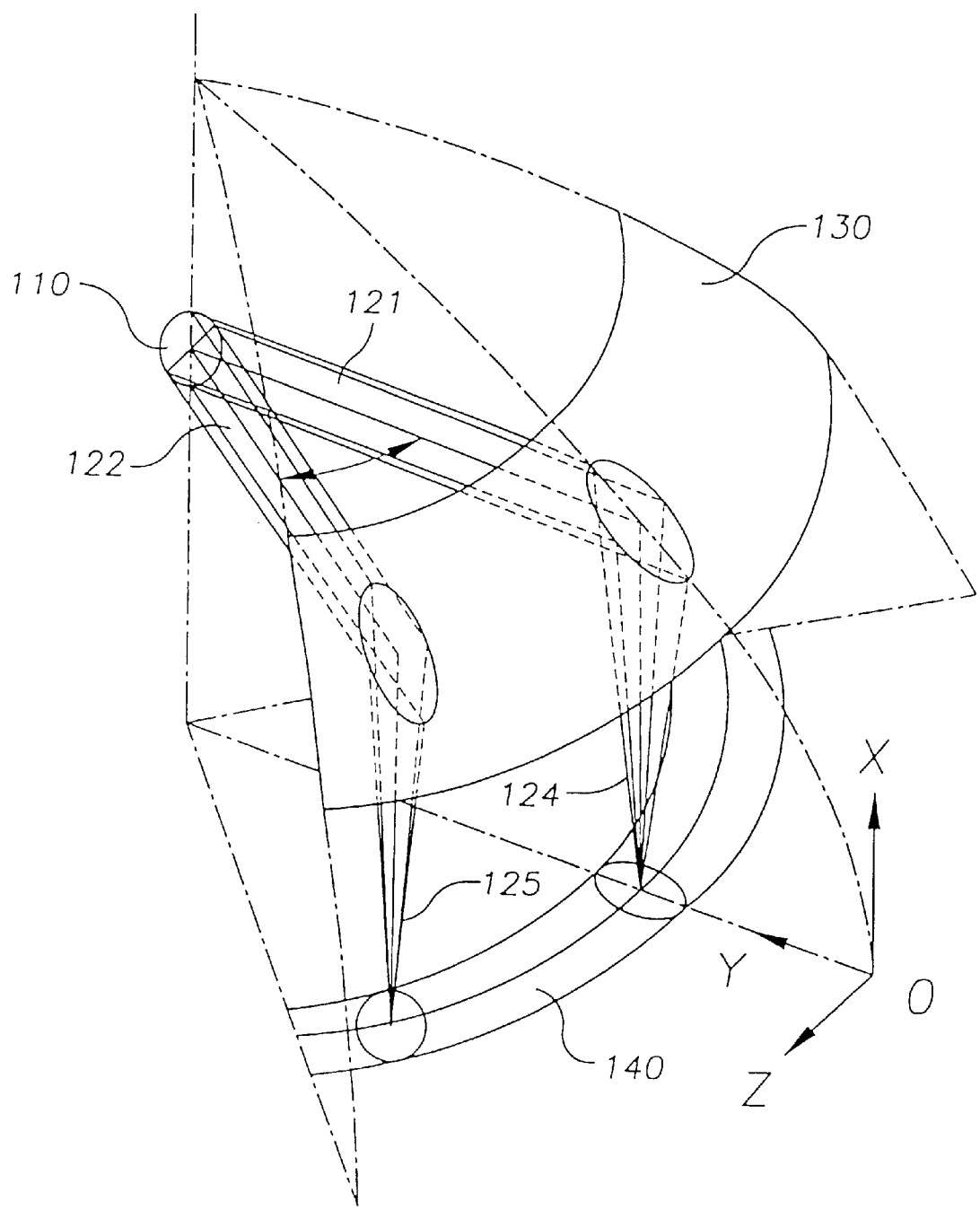

ILLUMINATION APPARATUS

FIELD OF THE INVENTION

The present invention relates to illumination apparatus and exposure apparatus, and in particular to illumination apparatus for use with soft X-ray projection exposure apparatus

BACKGROUND OF THE INVENTION

An exposure apparatus for semiconductor manufacturing is one that projects and transfers a circuit pattern formed on the surface of an object, such as a photomask (hereinafter, simply "mask"), onto a substrate, such as a wafer, through an image-forming apparatus, such as a projection lens. The substrate is coated with a light-sensitive material, such as photoresist. Upon exposure of the mask, a photoresist pattern is obtained on the substrate. To obtain a photoresist pattern over a desired area (i.e., exposure field), the mask must be illuminated by light having a uniform intensity and a uniform divergence angle. Accordingly, the illumination apparatus of such exposure apparatus have employed Kohler illumination to satisfy these conditions.

If the exposure light is X-rays, then the image-forming apparatus comprises a reflector. An off-axis circular arc-shaped (i.e., arcuate) exposure field is used, so that only an arcuate area on the mask is projected and transferred onto the wafer in a static exposure. Accordingly, the transfer of the circuit pattern on the entire mask onto the wafer is performed by simultaneously scanning the mask and wafer in fixed directions.

In a scanning-type exposure, it is desirable that the illumination optical system uniformly illuminate the entire arcuate area on the mask at a fixed numerical aperture. An illumination optical system that can accomplish this is disclosed in Japanese Patent Application Kokai No. Hei 7-235471, applied for by the present applicant.

The optical system disclosed in the above-mentioned Japanese Patent Application is shown herein in FIG. 6 and FIG. 7. X-rays 120, comprising beams 121 and 122, are emitted from light source (or light source image) 110 and are reflected by a special reflector 130, thereby forming convergent beams 124 and 125, respectively, which irradiate an arcuate area 140 on the mask (not shown). Arcuate area 140 is centered about a point 144 (see FIG. 6), and an X-Y-Z coordinate system is shown for reference.

As an example of a method of forming a light source for an illumination optical apparatus, an illumination apparatus of high illumination intensity is disclosed in Japanese Patent Application Kokai No. Hei 8-148414, applied for by the present applicant. With reference now to FIG. 8, illumination optical system 100 comprises an excitation energy light generation unit 101, a target member 103, and an illumination optical system 104 as the principle components. Excitation energy light rays 102 emitted from unit 101 irradiate a plurality of locations 110 on target member 103. X-rays 120 are respectively generated from locations 110, thereby forming a plurality of X-ray sources 110 (i.e., locations 110 become X-ray sources 110).

With reference now to FIGS. 9, 10a and 10b, parallel x-ray beams 121 and 122 are emitted from sources 110 in the sagittal direction (i.e., in the plane of the paper). When the emission angle θ is 0 degrees, beam 121 has a diameter p(θ)=q. When the emission angle is θ, beam 122 has a diameter p(θ)=q·cos θ. Light beam diameter p(θ) (in the plane of the paper) decreases as emission angle θ increases.

Accordingly, with reference now to FIGS. 10a and 10b, the cross section of beam 121 when the emission angle is 0 degrees is nearly circular (see FIG. 10a). This is in contrast to the cross section of beam 122, which cross section is elliptical when the emission angle is θ (see FIG. 10b). Beam 122 cross section (FIG. 10b) has a major axis p(0) in the meridional direction (i.e., perpendicular to the plane of the paper in FIG. 9) and a minor axis p(θ) in the sagittal direction.

With reference now to FIG. 11, when parallel beam 121, having an emission angle of 0 degrees (see FIG. 9), is subject to the converging action of reflector 130 (see FIG. 7), convergent beam 124 is formed. Beam 124 is conical and constantly extends an equal angle with respect to convergence point P1 in an arcuate illumination area (field) BF formed on the object (not shown) to be irradiated. In contrast, when parallel light beam 122, having an emission angle of θ (see FIG. 9) is subject to the converging action of reflector 130 (see FIG. 7), convergent light beam 125 is formed. Beam 125 converges in an elliptical spindle-shape at convergence point P2 in arcuate illumination area (field) BF on the object (not shown) to be irradiated.

Consequently, in the radial direction R at convergence point P2, the angle that convergent beam 125 extends with respect to convergence point P2 is equal to that of parallel beam 121 mentioned above. However, in the tangential direction T at convergence point P2, the angle that convergent light beam 125 extends with respect to convergence point P2 is smaller than that in the radial direction R at convergence point P2 (a multiple of cos θ). In addition, this effect is pronounced for parallel light beams with a large emission angle θ with respect to the sagittal direction. Thus, if an object is illuminated by an illumination apparatus which forms convergent light beams of a different cross-sectional shape, and an image of the object is formed by an image-forming apparatus, then the resolution of the image thus formed is generally not uniform over the image plane (exposure field). This is because a portion of the object is illuminated under conditions that do not satisfy the numerical aperture required by the image-forming apparatus.

Japanese Patent Application Kokai No. Hei 6-267894 discloses a method to solve the above-described problem by using a new image-forming optical system. However, since this optical system comprises a plurality of lenses, it is not useful in the X-ray region wherein lenses cannot be used. In addition, even the optical system disclosed therein comprised reflectors, the amount of X-rays obtained after reflection would be extremely small, since a plurality of reflectors would be necessary.

SUMMARY OF THE INVENTION

The present invention relates to illumination apparatus and exposure apparatus, and in particular to illumination apparatus for use with soft X-ray projection exposure apparatus. An objective of the present invention is to provide a high-performance illumination apparatus, wherein the illumination efficiency is markedly higher than in conventional apparatus, and the numerical aperture of the X-rays at the illumination area formed in a circular arc (i.e., an arcuate area) is nearly uniform, independent of the illumination position.

A first aspect of the invention is an illumination apparatus for illuminating an object. The apparatus comprises an excitation energy light generation unit for generating excitation energy light rays, and a target member having a curved surface and plurality of X-ray sources provided thereon. The plurality of X-ray sources emit X-rays when irradiated by the light rays. The target member is positioned relative to the light generation unit so that at least some of the light rays intercept the curved surface. The illumination apparatus further includes an illumination optical system that images the X-rays from the plurality of X-ray sources onto the object to be illuminated.

Since the plurality of X-ray sources is arranged on a curved surface, the numerical aperture at the illumination area formed in a circular arc is nearly uniform and independent of the illumination position. Consequently, the required numerical aperture of an image-forming optical system, used in combination with the illumination apparatus of the present invention, is met over the entire object. As a result, the imaging resolution is uniform over the entire image plane of the imaging-forming optical system.

A second aspect of the invention is the illumination apparatus as described above, wherein the curved surface of the target member is a cylindrical surface. The cylindrical surface can be easily manufactured and, in addition, the numerical aperture of the X-rays at the illumination area formed in a circular arc can easily be made nearly uniform, independent of the illumination position.

A third aspect of the invention is an illumination apparatus as described above, wherein the target member is tape-shaped and is provided along the curved surface. In so doing, the numerical aperture at the illumination area formed in a circular arc is nearly uniform, independent of the illumination position. In addition, the tape-shaped target member can be moved in accordance with the level of wear of the target member, and a new part can receive the excitation energy light rays. Thus, the illumination apparatus can be used over a long period of time.

A fourth aspect of the invention is an illumination apparatus as described above, wherein a particulate target member is used in the first means or second means, and is constituted so that a plurality of target members is formed on a curved surface. In so doing, the numerical aperture at the illumination area formed in a circular arc is nearly uniform, independent of the illumination position. In addition, the target member can be supplied continuously and, moreover, the amount of dispersed matter from the target member can be reduced.

A fifth aspect of the invention is an illumination apparatus as described above, wherein the target member is a liquid or a gas. As used herein, the phrase "liquid or a gas" means that it is a liquid or a gas at room temperature and room pressure. When used as a target member, it is possible that they may also be a solid or a liquid, respectively.

A sixth aspect of the invention is a method of illuminating an object. The method comprises the steps of first, providing a target member having a curved surface, then irradiating the curved surface at a plurality of locations with excitation energy light rays. The next step is emitting X-rays from the plurality of locations. Then, the final step is imaging X-rays from the X-ray sources onto the object. In a preferred embodiment, the latter step involves providing an illumination optical system adjacent the target member, and then imaging the X-rays through the illumination optical system.

BRIEF DESCRIPTION OF THE DRAWINGS

FIG. 7 is an oblique view of the prior art optical system of FIG. 6;

DETAILED DESCRIPTION OF THE INVENTION

The present invention relates to illumination apparatus and exposure apparatus, and in particular to illumination apparatus for use with soft X-ray projection exposure apparatus. A soft X-ray projection exposure apparatus transfers the circuit pattern on a photomask (i.e., a mask or reticle) onto a substrate, such as a wafer, through a reflective-type image-forming apparatus by means of a mirror projection system, such as an X-ray optical system. The present invention has the objective to provide a high-performance illumination apparatus, wherein the illumination efficiency is markedly higher than is conventional, and the numerical aperture of the X-rays at the illumination area formed in a circular arc (i.e., an arcuate area) is nearly uniform, independent of the illumination position.

Figure 1:
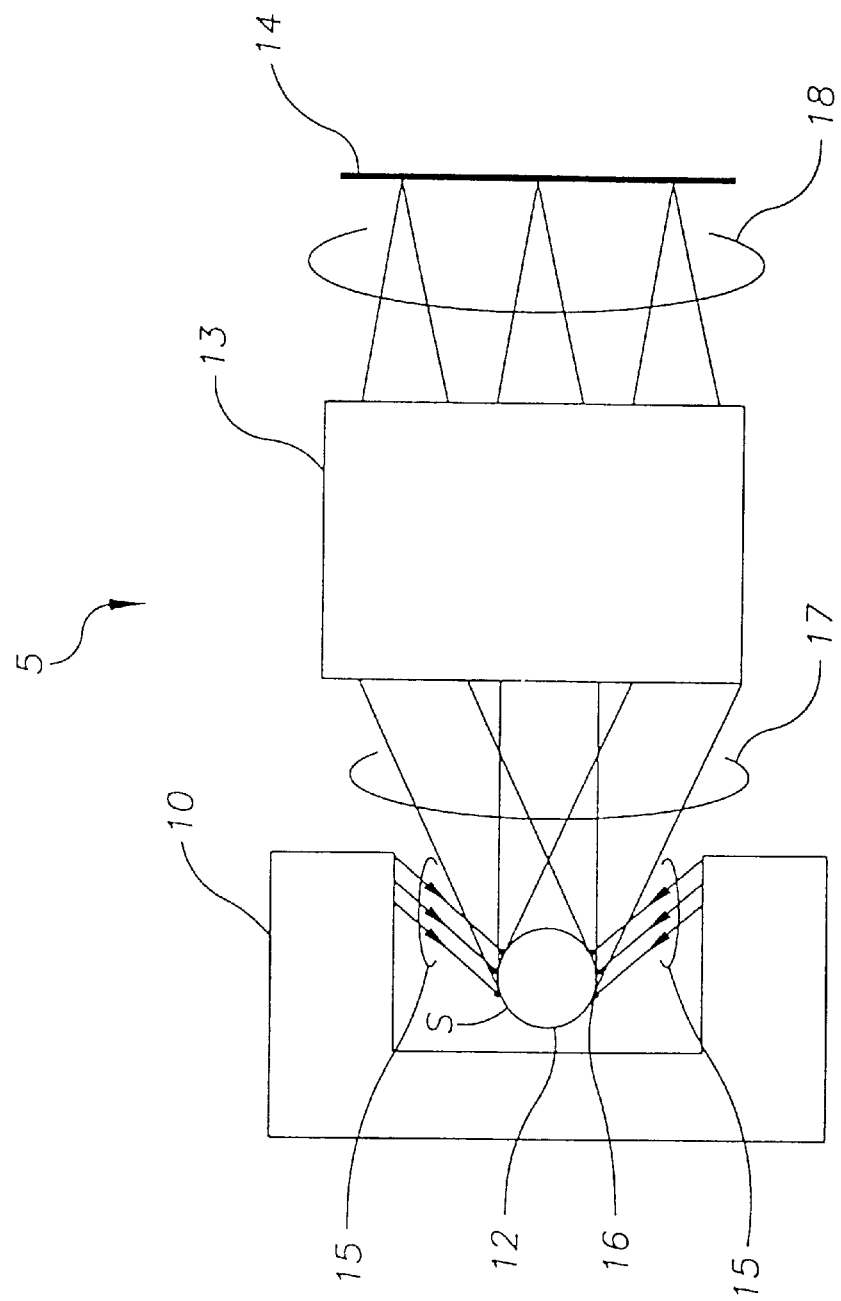
FIG. 1 is a schematic diagram of a preferred embodiment of an illumination apparatus of the present invention.

With reference to FIG. 1, the illumination apparatus 5 of the present invention comprises an excitation energy light generation unit 10, a target member 12, and an illumination optical system 13. Excitation energy light rays 15 are emitted from unit 10 and irradiate a plurality of locations 16 on target member 12. Target number 12 is capable of generating X-rays upon being irradiated with light of the appropriate wavelength. X-rays 17 are generated from locations 16 on target member 12 irradiated by excitation energy light rays 15. Thus, locations 16 become microscopic X-ray light sources 16. X-rays 17 emitted from sources 16 pass through illumination optical system 13 and irradiate a mask 14 as X-rays 18.

Figure 2:
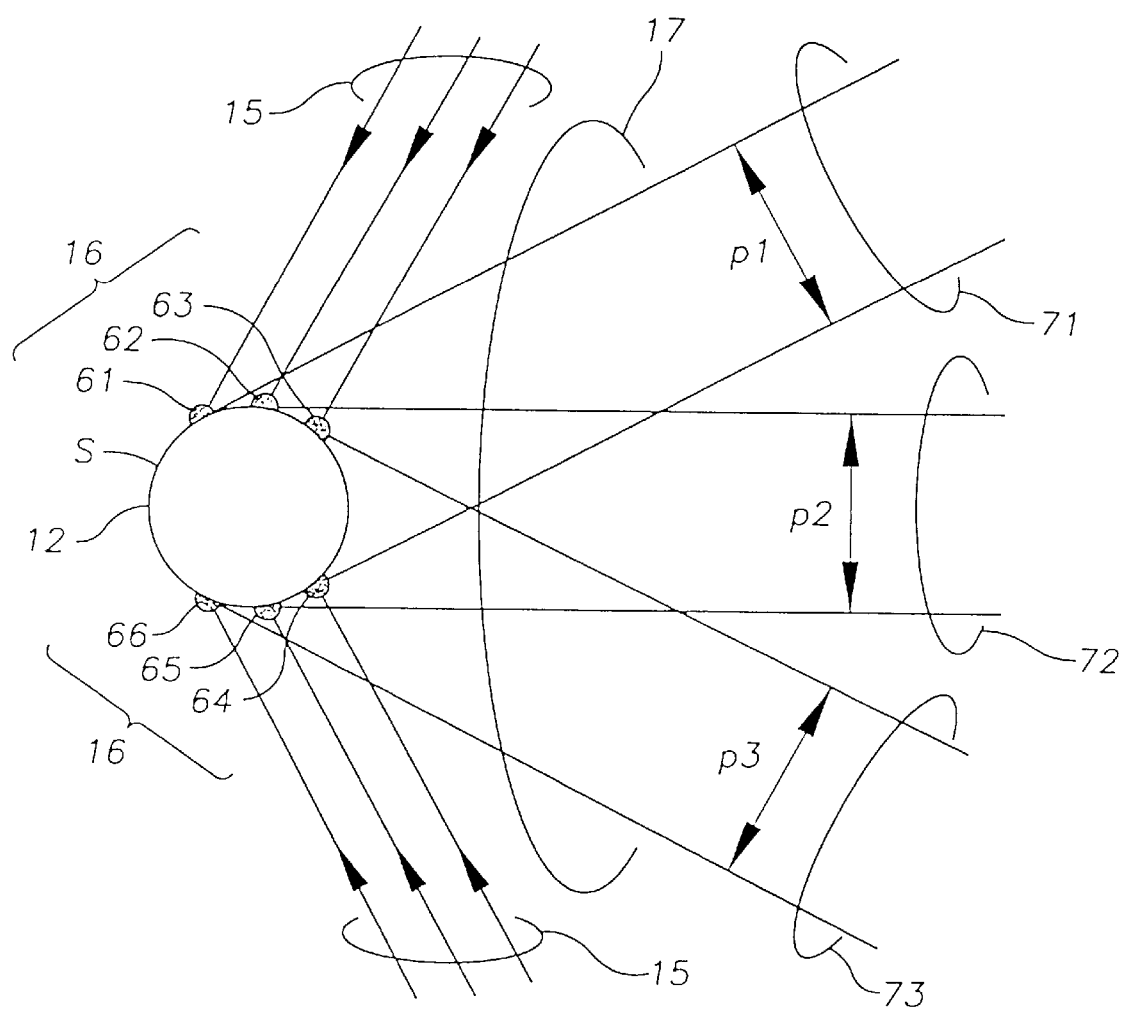
FIG. 2 is close-up view of a preferred embodiment of the target member of the illumination apparatus shown in FIG. 1.

With reference now to FIG. 2, by arranging a plurality of sources 16 (i.e., individual sources 61–66) on target member 12 having a curved surface S, widths p1–p3 of X-ray beams 71–73, respectively, constituting X-rays 17 can be controlled. For example, beam 71 includes X-rays emitted from sources 16, and in particular, includes X-rays emitted from sources 61 and 64, as well as from sources 62 and 63 therebetween (sources outside of source 62 and light source 63 are not illustrated). Similarly, beam 72 also includes the X-rays emitted from sources 16, and in particular, includes X-rays emitted from sources 62 and 65, as well as from sources 63 and 64 therebetween (sources outside of sources 63 and 64 are not illustrated). Likewise, beam 73 also includes X-rays emitted from sources 16, and in particular, includes X-rays emitted from sources 63 and 66, as well as from sources 64 and 65 therebetween (sources outside of sources 64 and 65 are not illustrated).

With continuing reference to FIG. 2, width p1 of beam 71 in the sagittal direction is determined by the space between sources 61 and 64. Likewise, width p2 of beam 72 in the sagittal direction is determined by the space between sources 62 and 65, and width p3 of beam 73 in the sagittal direction is determined by the space between sources 63 and 66. Accordingly, by forming sources 16 on the desired curved surface S of target member 12, widths p1–p3 of beams 71–73 emitted toward illumination optical system L13 can be made a desired width.

Figure 6:
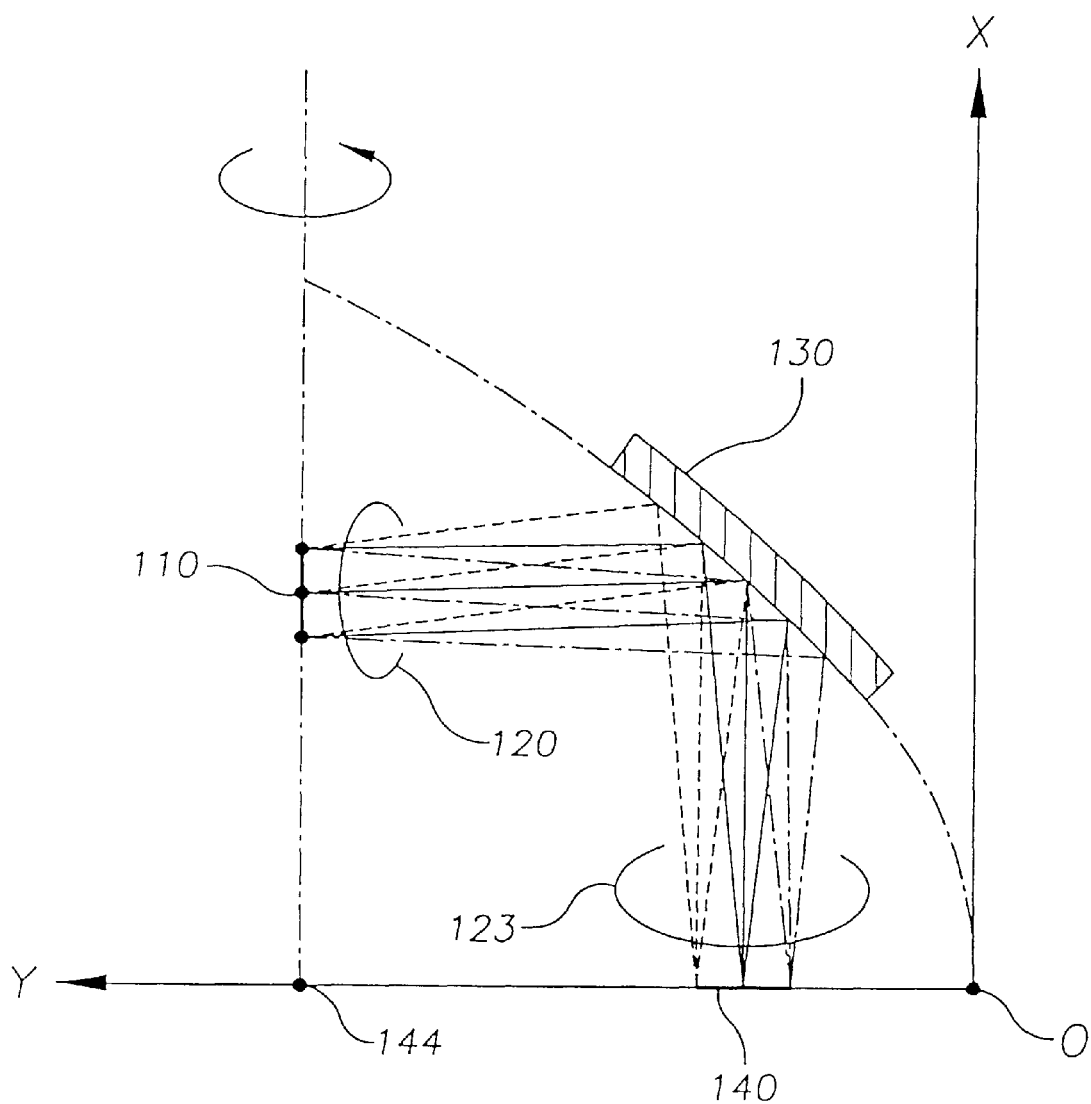
FIG. 6 is a schematic diagram of a prior art optical system used in a preferred embodiment of the illumination apparatus of the present invention, showing a cross-sectional view in the meridional direction of the light source, reflector, and the surface to be irradiated.
Figure 8:
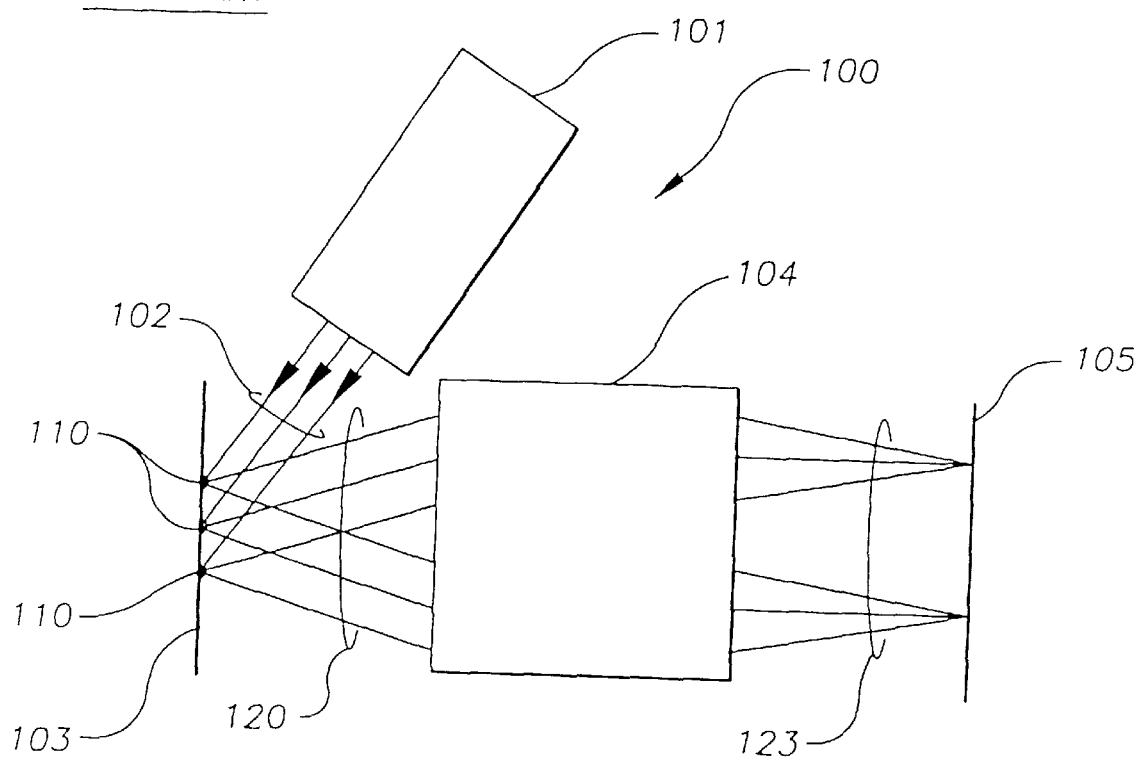
FIG. 8. is a schematic diagram of a conventional prior art illumination apparatus.
Figure 9:
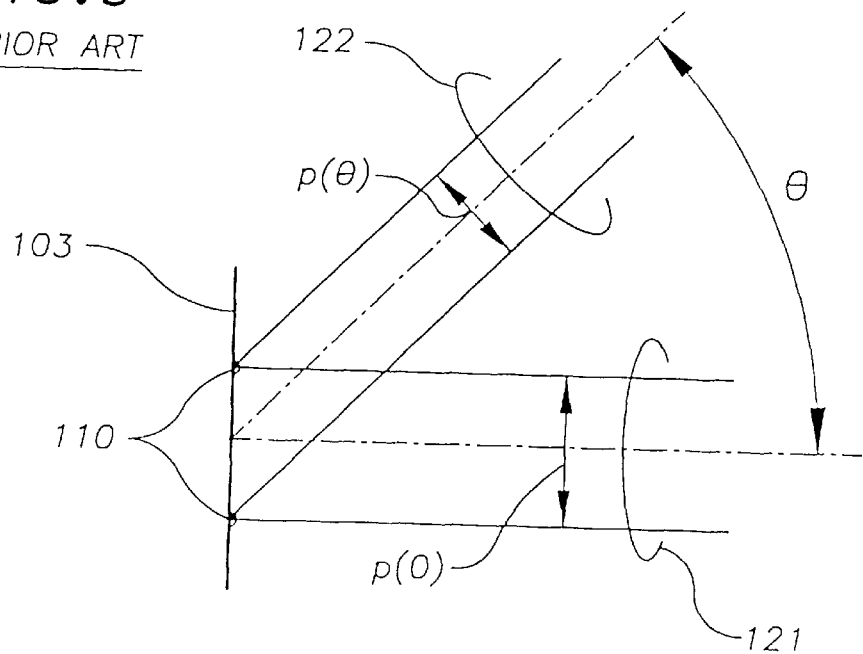
FIG. 9 is a close-up of the target member of the prior art illumination apparatus of FIG. 8, and is a partial cross-sectional view in the sagittal direction of the light source and the X-rays proceeding from the light source to the illumination optical system.
Figure 10A:
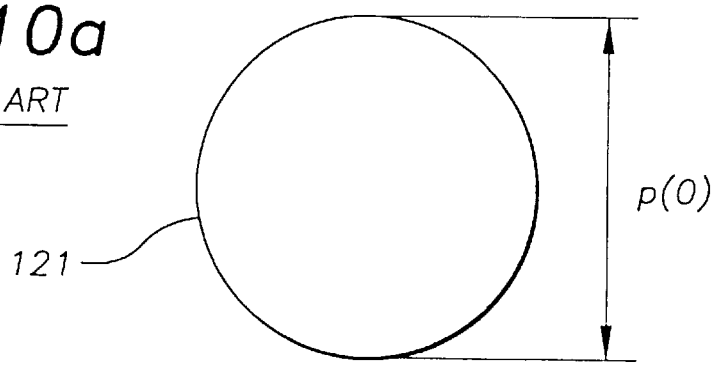
FIG. 10a is a cross-sectional view of the parallel light beam emitted from the light source at an emission angle of 0 degrees in the illumination apparatus of FIG. 9.
Figure 10B:
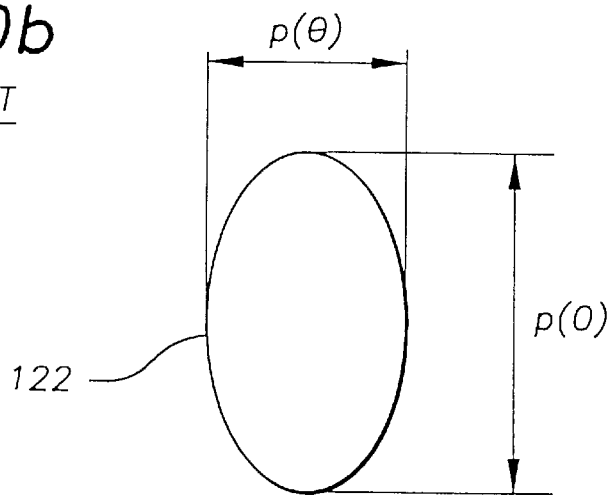
FIG. 10b is a cross-sectional view of the parallel light beam emitted from the light source at an emission angle of θ in the illumination apparatus of FIG. 9.

In a preferred embodiment, curved surface S of target member 12 is shaped such that X-rays 18 illuminate mask 14 at a roughly uniform numerical aperture (see FIG. 1). In particular, if an optical system such as the one shown in FIGS. 6 and 7 is used as illumination optical system 13 in the present invention, it is preferable that curved surface S be made cylindrical. In so doing, widths p1–p3 of beams 71–73 emitted from light sources 16 are equal. Thus, arcuate illumination area 140 (see FIG. 7) can be illuminated at a uniform numerical aperture.

With reference again to FIG. 2, target member 12 can be considered to have a cylindrically curved surface S. Accordingly, if light sources 61–66 are arranged on cylindrical surface S, then light beams 71–73 have the same widths p1–p3 (i.e., p1=p2=p3), since the spaces between light source 61 and 64, between light source 62 and 65, and between light source 63 and 66, respectively, are equal to the diameter of the circular cross section of target member 12. In other words, sources 16 form the shape of curved surface S such that widths p1–p3 of each beam 71–73 is equal, or nearly so.

Figure 11:
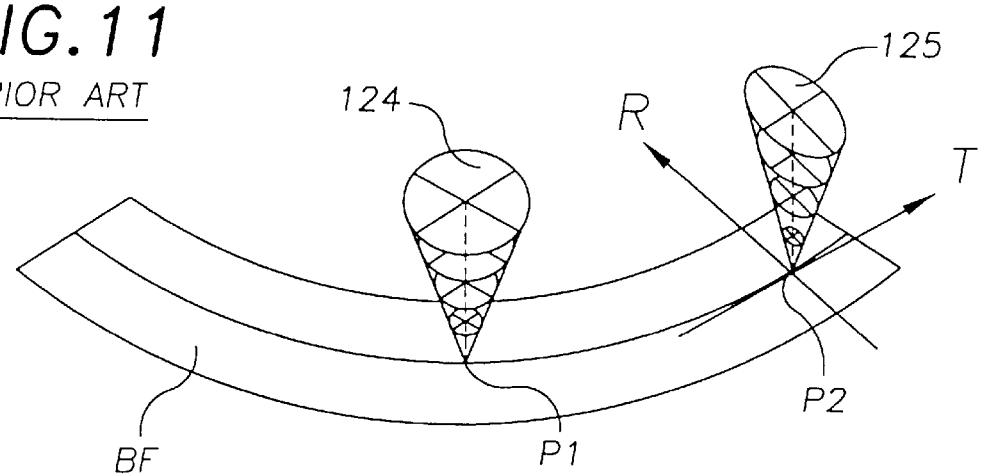
FIG. 11 is an schematic diagram of the light beams that converges on the surface to be irradiated in the illumination apparatus of FIG. 9.

Thus, with reference now to FIGS. 7 and 11, beams 124 and 125 converging on arcuate illumination area (field) BF have a cone shape, while constantly extending an equal angle with respect to the convergent point at every part (i.e., have a uniform cross-section), and the numerical aperture at the illumination area is equal and is independent of the illumination position.

Figure 3:
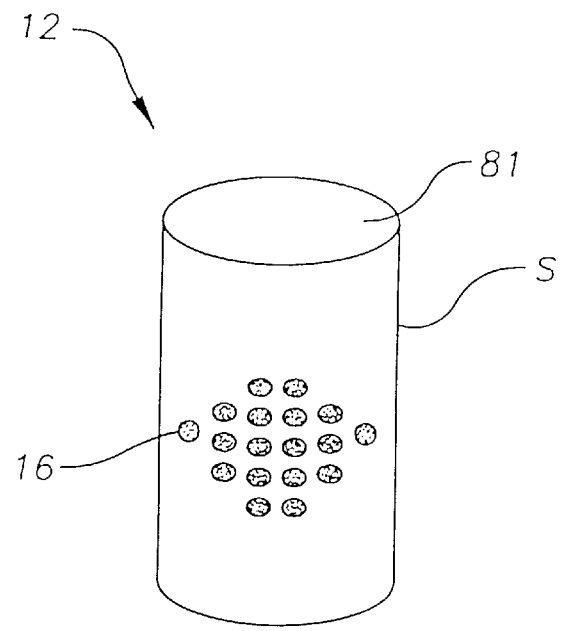
FIG. 3 is a schematic diagram of a preferred embodiment of a target member used in the illumination apparatus of the present invention.

With reference now to FIG. 3, target member 12 on which X-ray sources 16 are formed can comprise a solid member 81 having curved surface S with a given shape, as shown. The shape in which sources 16 is arranged can be determined by the shape of curved surface S. Since member 81 can be designed to have curved surface S be of any desired shape, it is relatively straightforward to control the shape (i.e., curvature) of curved surface S on which light sources 16 are arranged.

Generally, target member 12 tends to wear down when X-ray sources 16 are used over an extended period of time. Thus, with reference now to FIG. 4, it is preferable that a new target member be supplied. By providing a tape-shaped target member 82 moveable along curved surface S of a substrate 83, the target member can be continuously supplied. Tape-shaped target member 82 can be easily created in a desired curved surface shape by pressing or winding it onto substrate 83 having a desired shape of curved surface S, for example.

Figure 5:
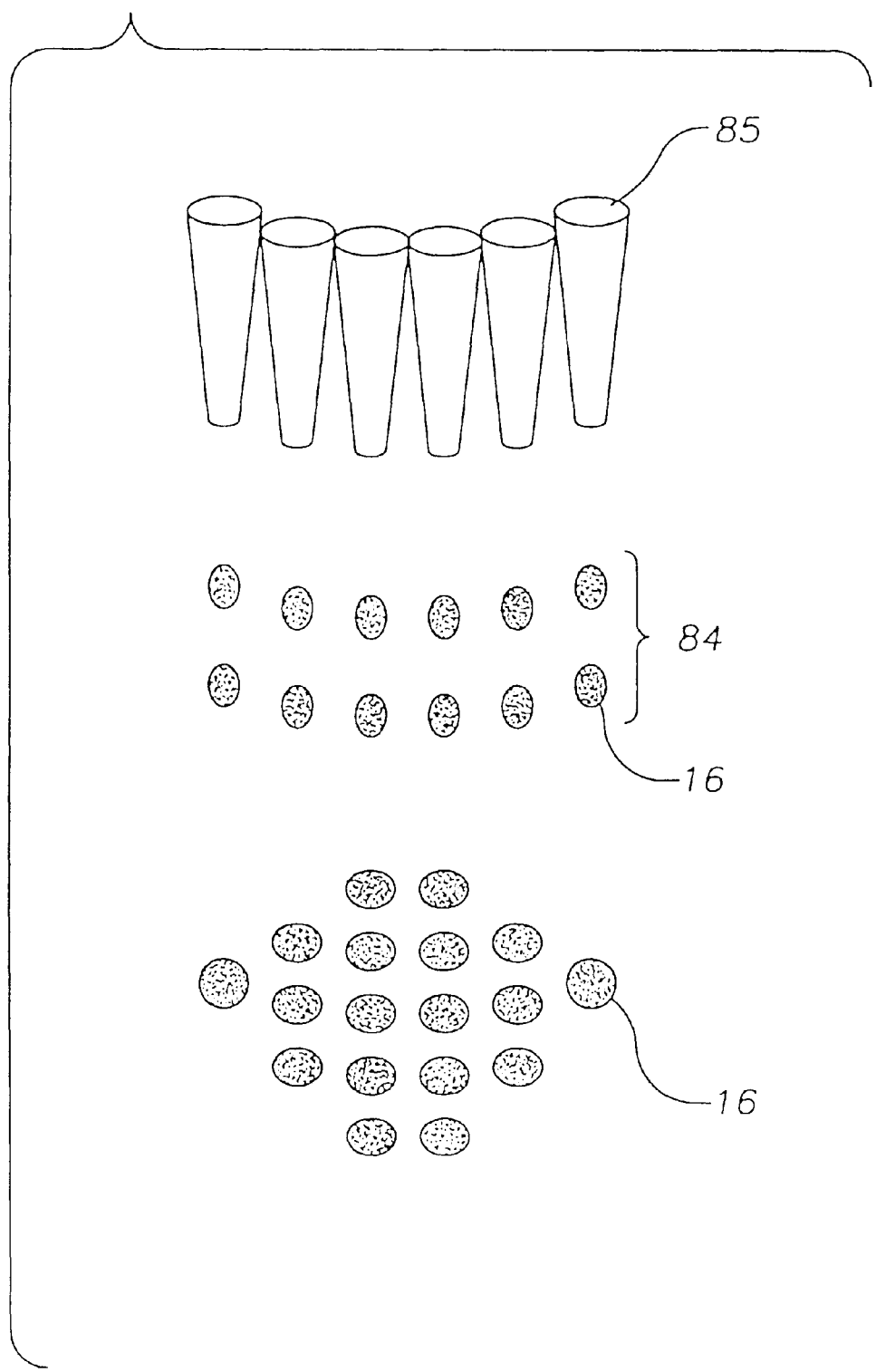
FIG. 5 is a schematic diagram of another preferred embodiment of a target example of the target member used in the illumination apparatus according to the present invention.

With reference now to FIG. 5, a particulate target member 84 may also be employed. Particulate target member 84 is supplied by a particulate target member supply unit 85 (e.g., a nozzle). Further, particulate target member 84 is preferably arranged to have a desired curved surface shape. Since the position of particulate target member 84, e.g., the nozzle position, can control the angle at which the particles are emitted from the nozzle, and can control the emission speed of the particles and the like, it is easy to arrange sources 16 to have a desired curved surface shape. This method also has advantage that particulate target member 84 can be supplied continuously. Moreover, the amount of dispersed matter from particulate target member 84 can be reduced.

In addition, if a pulsed laser is included in excitation energy light generation unit 10 so that X-rays 17 are generated in pulses (see FIG. 1), the pulsed laser light can illuminate particulate target member 84, which is supplied continuously. X-rays can thus be generated by synchronizing the supply of particulate target member 84 from nozzle 85 with the timing of the generation of pulsed laser light.

With reference again to FIG. 1, it is preferable that illumination optical system 13 illuminate mask 14 with X-rays 18 at a uniform intensity and at a uniform divergence angle. In particular, it is preferable to arrange target member 12 in the vicinity of the front focal position of illumination optical system 13. In this case, X-rays 17 emitted from each X-ray source 16 pass through illumination optical system 13, and then are transformed into parallel light and the like and irradiate mask 14. Further-more, X-rays 17 emitted from each light source 16 irradiate mask 14 at various angles. Accordingly, mask 14 is illuminated by Kohler illumination or in a manner similar to Kohler illumination.

In addition, it is preferable that illumination optical system 13 comprise a reflector (not shown), which preferably includes a multilayer film to increase the reflectance of the reflector surface. As previously discussed, excitation energy light rays 15 irradiate a plurality of locations 16 on target member 12, and X-rays 17 are generated from each of these locations, which become light sources 16. In this case, excitation energy light rays 15 can irradiate all locations (sources) 16 simultaneously, or can irradiate them separately or sequentially. The locations (sources) 16 on target member 12 to be irradiated should take into consideration the specifications required by the illumination optical system, such as, the intensity and divergence angle of X-rays 18, which illuminate the mask, the uniformity thereof, and the like.

With continued reference to FIG. 1, when performing static (i.e., non-scanning) illumination of the mask, as in conventional exposure apparatuses, light sources 16 should be arranged two-dimensionally. In addition, in the case of soft X-ray exposure apparatus M, a band-shaped or belt-shaped area (illumination field) may be scanned and exposed due to design limitations of the image-forming optical system. In this case, it is preferable to perform critical Kohler illumination, as described in Japanese Patent Application Kokai No. Hei 7-235470, and light sources 16 should be arranged one-dimensionally. In other words, target member 12 should be arranged one-dimensionally, or when target member 12 is arranged in a plane, it should be irradiated by a one-dimensional (line-shaped) excitation energy light rays 15.

In another preferred embodiment of the present invention, it is preferable to use an excitation energy light generation unit 10 that can change the path of excitation energy light rays 15, that can split the excitation energy light rays into a plurality of paths or beams, or that a plurality of excitation energy light generation sources, and the like. Changing the ray path of the excitation energy light rays 15 may be achieved, for example, by moving (e.g., oscillating) an optical element.

In another preferred embodiment of the present invention, the excitation energy light rays 15 may be split into a plurality of excitation energy light beams. This may be accomplished using, for example, an optical element, like a beam splitter or a micro-lens array. The intensity of X-rays emitted from sources 16 is determined principally by the intensity of excitation energy light rays 15. Accordingly, the intensity of each of sources 16 can be flexibly adjusted by controlling the intensity of each light beam.

In an additional preferred embodiment of the present invention, excitation energy light generation unit 10 includes a laser as a light generation source. If a plurality of laser light generation sources is employed, the intensity of the laser light can be increased to each of sources 16. In this manner, the intensity of X-rays 17 generated from sources 16 can be increased. In other words, this method can be employed if it is desired to increase the throughput of the soft X-ray projection exposure apparatus.

The present invention is not limited to light generation sources and optical arrangements as described above. Rather, these are just examples. Although there are cases wherein optical elements are needed when changing the path of laser light or splitting laser light, these do not reduce the intensity of the laser light. This is because the reflectance and transmittance of laser light through laser optical elements is generally nearly 100%. Accordingly, high-intensity X-rays are emitted from each of sources 16.

Also, in the illumination apparatus of the present invention, the material comprising target member 12 varies according to the X-rays to be generated. Generally, it is preferable to use a material with a high X-ray generation efficiency. For example, to generate X-rays of a 13 nm wavelength, tin, antimony, lead, tungsten, tantalum, and gold and the like are preferred. In addition, materials with a low melting point and materials that are liquid or gas at room temperature may be used. Materials that are solidified or condensed by cooling and the like can also be used and, moreover, liquids or gases can be used as is. The latter case will often be preferable since the generation of dispersed matter (debris) can be reduced.

With reference again to FIG. 1, if excitation energy light rays 15 irradiate target member 12 to generate soft X-rays, it is preferable to use a laser plasma X-ray source as a light generation source in excitation energy light generation unit 10. In this regard, high-intensity soft X-rays can be generated by using laser light as the excitation energy light. Furthermore, in a preferred embodiment, a high-intensity laser may be used to provide laser light. For example, a YAG laser, excimer laser, glass laser or titanium sapphire laser, may be used to obtain a separate high-intensity X-ray source.

In addition, excitation energy light rays 15 that illuminate target member 12 are not limited to laser light rays. For instance, the excitation energy light rays 15 may be from a source that can generate soft X-rays, such as an electron beam from an electron beam unit, and the like. Soft X-ray optical systems are often placed in a vacuum, since the absorption of X-rays due to air and the like is large. Accordingly, such systems are well-suited to using an electron beam in illumination apparatus 5.

The illumination apparatus according to the present invention can also form a light source equivalent to a secondary light source of a conventional illumination apparatus, without using an X-ray integrator. Moreover, such a light source is superior in that the widths of the light beams emitted from the light sources can be controlled.

Since the loss in intensity of the laser light due to the optical system is extremely small, a high-intensity X-ray light source can be obtained. Furthermore, every illumination point on the mask can be illuminated at the desired numerical aperture. By using the exposure apparatus according to the present invention, it is possible to supply high-intensity uniform illumination light, and a soft X-ray exposure apparatus that can expose a large area at high throughput can be provided.

WORKING EXAMPLES

The present invention is now described in greater detail based on three Working Examples. With reference to FIGS. 1 and 2, in each of the Working Examples below, the relevant illumination apparatus 5 comprises three principal components: excitation energy light generation unit 10, target member 12 and illumination optical system 13. A plurality of excitation energy light rays 15 are emitted from excitation energy light generation unit 10, and irradiate a plurality of locations 16 on target member 12. A YAG laser light is included in light generation unit 10 as a light generation source and a beam splitter (not shown) is used to split the beam emanating therefrom, thereby generating excitation energy light rays 15 as light beams.

With reference to FIG. 1, in each of the Working Examples, X-rays 17 emitted from light sources 16 pass through illumination optical system 13 and irradiate mask 14 as X-rays 18. Illumination optical system 13 comprises a reflector (not shown) provided with a molybdenum and silicon multilayer film on the surface, which reflects X-rays having a wavelength in the vicinity of 13 nm. Also, a portion of mask 14 spanning an area 120 mm long and 5 mm wide is irradiated by X-rays 18 over an arcuate illumination area. At this point, mask 14 is Kohler illuminated by arranging target member 12 in the vicinity of the front focal position of illumination optical system 13. As a result, the entire arcuate illumination area (field) on mask 14 can be illuminated at a uniform numerical aperture. In addition, upon exposing a photoresist-coated substrate with an exposure apparatus provided with the illumination apparatus according to the present invention, a photo resist pattern of the desired shape can be obtained across the entire exposure area (field). However, a resist pattern of the desired shape could not be obtained over the entire exposure area with an exposure apparatus provided with a conventional illumination apparatus.

Working Example 1

In Working Example 1, target member 12 is cylindrical and is comprised of tin (see FIG. 3). X-rays with a wavelength of at least 13 nm are generated from the locations 16 irradiated by excitation energy light rays 15. X-rays 17 are generated from a plurality of locations (i.e., light sources) 16 on target member 12.

Working Example 2

Figure 4:
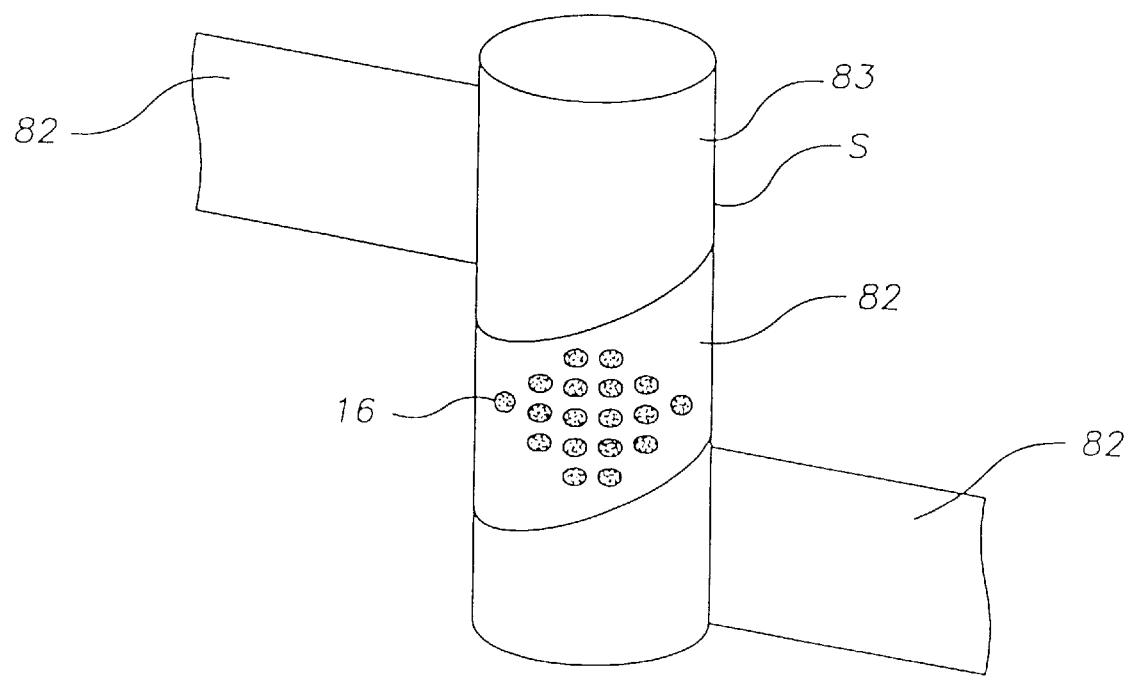
FIG. 4 is a schematic diagram that shows another preferred embodiment of a target member used in the illumination apparatus according to the present invention.

In Working Example 2, target member 82 is a tape-shaped thin plate, as shown in FIG. 4. Target member (Plate) 82 is comprised of tungsten. Target member 82 is wound on cylindrical substrate 83 and arranged so that the shape of surface S forms a part of the cylinder shape. Furthermore, target member 82 is made so that it can be supplied continuously by offsetting its position in the longitudinal direction thereof. X-rays with a wavelength of at lease 13 nm are generated from the part irradiated by excitation energy light rays 15, and X-rays 17 are generated from a plurality of locations (i.e., light sources) 16 on target member 82.

Working Example 3

In Working Example 3, target member 84 is made of ice particles (particulates) 16 having diameter on the order of 100 μm, as shown in FIG. 5. Particulate target member 84 is supplied from nozzle 85, and made so that a cylindrical surface is formed by plurality of ice particles 16. If excitation energy light rays 15 irradiate particles 16, X-rays with a wavelength of at least 13 nm are generated. X-rays 17 are generated from a plurality of "locations" (i.e., particulates) 16 on target member 84, thereby becoming sources 16, as discussed above.

As explained above, illumination apparatus 5 according to the present invention includes an excitation energy light generation unit 10 that generates excitation energy light rays 15. Light rays 15 irradiate a plurality of locations on target member 12, thereby forming a plurality of X-ray sources 16 corresponding to the aforementioned plurality of locations. Illumination apparatus 5 further includes illumination optical system 13 that irradiates the object to be illuminated with X-rays from the plurality of X-ray sources. The object to be irradiated can be Kohler illuminated at a high illumination efficiency and uniform numerical aperture, since a plurality of sources 16 are arranged on a curved surface S. In other words, the object to be illuminated can be illuminated by X-rays having a uniform intensity and uniform divergence.

In addition, since the illumination apparatus according to the present invention can form a light source equivalent to the two-dimensional light source of a conventional illumination apparatus without using an X-ray integrator, it has advantages in that the transmittance (utilization efficiency) of X-rays is high compared with conventional apparatus. Further, it is easy to manufacture. Consequently, the pattern of a mask can be transferred faithfully onto substrates at a high throughput.

The above Working Examples are examples of the present invention, and do not limit the present invention. For instance, with regard to Working Example 2, which employs ice particles as the target member, the present invention is not so limited. For instance, gas can be discharged from a nozzle, and the discharged gas or clusters generated by adiabatic expansion may also be used as the target member. Indeed, it will be apparent to one skilled in the art that the number and arrangement of light sources 16 are also not limited to the ones shown in the Working Examples. Light sources 16 arranged one-dimensionally can also be easily created and used in the present invention. Accordingly, the present invention can also be applied to critical Kohler illumination. Thus, the present invention is intended to cover all alternatives, modifications and equivalents as may be included within the spirit and scope of the invention as defined in the appended claims.

What is claimed is:

1. An illumination apparatus for illuminating an object, the apparatus comprising:

a) an excitation energy light generation unit for generating excitation energy light rays;

b) a target member having a curved surface and a plurality of X-ray sources provided on said curved surface that emit X-rays simultaneously when irradiated by said light rays, wherein said target member is positioned relative to said light generation unit so that at least some of said light rays intercept said curved surface; and c) an illumination optical system that images said X-rays from said plurality of X-ray sources onto the object.

2. An illumination apparatus according to claim 1, wherein said curved surface is cylindrical.

3. An illumination apparatus according to claim 1 or claim 2, wherein said target member is tape-shaped, and is provided along said curved surface.

4. An illumination apparatus according to claim 1 or claim 2, wherein said target member is particulate, and a plurality of target members form said curved surface.

5. An illumination apparatus according to claim 1 or claim 2, wherein said target member comprises a liquid.

6. An illumination apparatus according to claim 1 or claim 2, wherein said target member comprises a gas.

7. An illumination apparatus according to claim 1, wherein said target member comprises a material selected from the group of materials consisting of: tin, antimony, lead, tungsten, tantalum, and gold.

8. An illumination apparatus according to claim 1, wherein said excitation energy light generation unit includes a laser.

9. An illumination apparatus according to claim 1, wherein said excitation energy light generation unit includes an electron beam unit.

10. An illumination apparatus according to claim 1, wherein said illumination optical system includes a reflector.

11. An illumination apparatus according to claim 1, wherein said illumination optical system includes an optical element for creating a plurality of excitation energy light beams.

12. An optical exposure apparatus capable of forming an image of an object, the apparatus comprising:

a) the illumination apparatus of claim 1; and b) an image-forming optical system adjacent the object to be illuminated.

13. A method of illuminating an object comprising the steps of:

a) providing a target member having a curved surface;

b) irradiating said curved surface at a plurality of locations with excitation energy light rays;

c) emitting X-rays simultaneously from said plurality of locations; and d) imaging said X-rays onto the object.

14. A method according to claim 13, wherein said step d) involves providing an illumination optical system adjacent said target member and imaging said X-rays through said illumination optical system.

15. A method of illuminating an object, comprising the steps of:

a) directing excitation energy light to a plurality of locations on a curved surface;

b) transforming said light to X-rays at said plurality of locations simultaneously; and c) imaging said X-rays onto the object.

* * * * *